(12) United States Patent
Won

(10) Patent No.: US 8,519,548 B2
(45) Date of Patent: Aug. 27, 2013

(54) WAFER LEVEL PACKAGED GAN POWER DEVICE AND THE MANUFACTURING METHOD THEREOF

(75) Inventor: Ju Chull Won, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 99 days.

(21) Appl. No.: 13/185,780

(22) Filed: Jul. 19, 2011

(65) Prior Publication Data

US 2012/0126240 A1 May 24, 2012

(51) Int. Cl.
*H01L 23/48* (2006.01)

(52) U.S. Cl.
USPC .......................... 257/778; 257/713

(58) Field of Classification Search
USPC ................. 257/778, 779, 773, 713
See application file for complete search history.

(56) References Cited

U.S. PATENT DOCUMENTS

| | | | |
|---|---|---|---|
| 6,825,559 B2 | 11/2004 | Mishra et al. | |
| 2012/0126240 A1* | 5/2012 | Won | 257/76 |

FOREIGN PATENT DOCUMENTS

KR  20090122210 A  11/2009

OTHER PUBLICATIONS

Jo das et al., "Improved Thermal Performance of AlGaN/GaN HEMTs by an Optimized Flip-Chip Design", IEEE Transactions on Electron Devices, vol. 53, No. 11, Nov. 2006, pp. 2696-2702.

* cited by examiner

*Primary Examiner* — Mark Prenty
(74) *Attorney, Agent, or Firm* — Rabin & Berdo, P.C.

(57) ABSTRACT

Disclosed are a GaN-based compound power semiconductor device and a manufacturing method thereof, in which on a GaN power semiconductor element, a contact pad is formed for flip-chip bonding, and a bonding pad of a module substrate to be mounted with the GaN power semiconductor element is formed with a bump so as to modularize an individual semiconductor element. In the disclosed GaN-based compound power semiconductor device, an AlGaN HEMT element is flip-chip bonded to the substrate, so that heat generated from the element can be efficiently radiated.

7 Claims, 4 Drawing Sheets

WAFER LEVEL PACKAGED GAN POWER DEVICE AND THE MANUFACTURING METHOD THEREOF

CROSS-REFERENCE TO RELATED APPLICATIONS

This application is based on and claims priority from Korean Patent Application No. 10-2010-0115894, filed on Nov. 19, 2010, and No. 10-2010-0127921, filed on Dec. 14, 2010, with the Korean Intellectual Property Office, the disclosure of which is incorporated herein in its entirety by reference.

BACKGROUND OF THE INVENTION

1. Field of the Invention

The present invention relates to a GaN (gallium nitride)-based compound power semiconductor device and a manufacturing method thereof. More particularly, the present invention relates to a GaN-based compound power semiconductor device and a manufacturing method thereof, in which on a GaN power semiconductor element, a contact pad is formed for flip-chip bonding, and a bonding pad of a module substrate to be mounted with the GaN power semiconductor element is formed with a bump so as to modularize an individual semiconductor element.

2. Description of the Prior Art

A high electron mobility transistor AlGaN/GaN (HEMT) element is a power semiconductor element frequently used in the field requiring high power, which is bonded by a wire bonding method or a flip-chip method. As a power semiconductor element, a GaN (gallium nitride) HEMT element has an output power ranging from several W to 100 W, or more, and generates considerable heat. Thus, its heat emission has to be well performed. Meanwhile, in a case of an RF HEMT, a parasitic inductance has to be low.

Accordingly, a high power RF HEMT element is preferably bonded by a flip-chip bonding method having advantages of a high heat emission characteristic and a low parasitic inductance, and has to be designed with a structure allowing heat to be sufficiently emitted. Also, in module manufacture, a substrate to be mounted with the HEMT element has to be designed and manufactured in such a manner that it is made of a high heat-emissive material, and has a high heat-emissive structure.

SUMMARY OF THE INVENTION

Accordingly, an object of the present invention is to provide a GaN-based compound power semiconductor device having a contact pad and a manufacturing method thereof, in which the contact pad has a structure allowing heat generated from an active element to be sufficiently emitted.

Also, an object of the present invention is to provide a GaN-based compound power semiconductor device and a manufacturing method thereof, in which the position and the structure of a pad of a substrate to be mounted with an active element are formed in such a manner that heat generated from the active element can be sufficiently emitted.

Also, an object of the present invention is to provide a GaN-based compound power semiconductor device and a manufacturing method thereof, in which a bump for flip-chip bonding is formed with a diameter of about 15 to 20 μm by using wafer level packaging so that heat generated from an active element can be sufficiently emitted.

Also, an object of the present invention is to provide a GaN-based compound power semiconductor device and a manufacturing method thereof, in which the structure of a substrate is formed in such a manner that heat generated from an active element can be sufficiently emitted through the substrate.

In accordance with an aspect of the present invention, there is provided a GaN-based compound power semiconductor device including: a GaN-based compound element grown and formed on a wafer; a contact pad for forming a source, a drain, and a gate in the GaN-based compound element; a module substrate to which the GaN-based compound element is flip-chip bonded; a bonding pad formed on the module substrate; and a bump formed on the bonding pad of the module substrate in such a manner that the contact pad of the GaN-based compound element is bonded to the bonding pad of the module substrate to flip-chip bond the GaN-based compound element to the module substrate.

In accordance with another aspect of the present invention, there is provided a method for manufacturing a GaN-based compound power semiconductor device, the method including the steps of: forming an element layer by growing a GaN-based compound element on a wafer; forming a contact pad for forming a source, a drain, and a gate in the GaN-based compound element; forming a bonding pad on a module substrate at a position corresponding to the formed contact pad; and forming a bump on the bonding pad of the module substrate, and flip-chip bonding the GaN-based compound element to the module substrate by bonding the contact pad of the GaN-based compound element to the bonding pad of the module substrate through the formed bump.

In the present invention, on a drain contact portion generating a large amount of heat in an AlGaN/GaN HEMT element, a sub contact pad (a sub drain contact pad) is formed. Thus, there is an advantage in that the heat can be efficiently emitted through a bump bonded to the pad.

Also, due to the structure of a bonding pad of the AlGaN/GaN HEMT element and the structure of a substrate, according to the present invention, a contact pad and a sub contact pad of an active element can sufficiently emit heat through connection to a substrate pad and a bump.

Also, according to the present invention, the bump is formed using wafer level packaging, so that a process cost can be reduced.

Also, according to the present invention, there is an advantage in that since the bump is formed on a substrate pad, a risk of work is less than that in formation of a bump on an active element pad.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
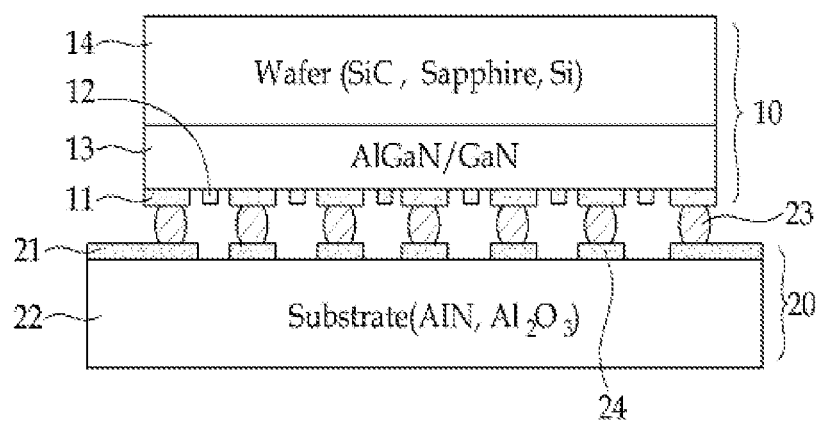
FIG. 1 is a configuration view illustrating an AlGaN/GaN HEMT element according to an embodiment of the present invention, flip-chip bonded to a module substrate.

The present invention relates to a GaN-based compound power semiconductor device and a manufacturing method thereof, in which on an active element used for a power semiconductor, a chip pad in a shape to be flip-chip bonded is formed so as to increase the efficiency of heat emission. Herein, the device according to an embodiment of the present invention has a structure in which heat generated from a drain adjacent to a gate can be efficiently emitted, since the gate of active element is a part generating the largest amount of heat.

Accordingly, in the present invention, a module substrate to be mounted with an active element is formed with a bonding pad in such a manner that the active element can be flip-chip bonded. Also, the flip-chip bonding is realized by forming a bump on the bonding pad of the module substrate. Herein, the bump is formed using wafer level packaging.

Furthermore, according to an embodiment of the present invention, a thermal via is formed in the substrate in such a manner that the heat generated from the active element can be easily emitted through the substrate.

Meanwhile, according to an embodiment of the present invention, a source contact pad of the active element may have a plurality of thermal pads formed at the edge of the active element except for a drain contact pad, and a gate pad in order to achieve stability of grounding and heat emission.

One drain contact pad may include a plurality of drain contact portions. However, in an embodiment of the present invention, a drain contact pad has a sub contact pad (that is, a sub drain contact pad) corresponding to each drain contact portion, and may be formed in such a manner that one drain contact pad has respective drains connected to each other.

Meanwhile, in order to realize the features of the present invention, in the active element according to an embodiment of the present invention, passivation of a contact pad has to be opened so as to carry out flip-chip bonding. Also, a substrate according to an embodiment of the present invention has to be made of a material which can effectively emit the heat generated from the active element.

Furthermore, according to an embodiment of the present invention, the substrate is formed with a thermal via in such a manner that the heat generated from the active element can be easily emitted through the substrate, and the via is filled with a metal. Herein, when the thermal via is filled with the metal, a printing process is used. Finally, according to an embodiment of the present invention, on the front surface of the substrate, an active element is mounted. Also, on the rear surface of the substrate, a metal such as Au is thinly deposited so that it directly contacts with a module surface in order to easily emit heat.

Hereinafter, an embodiment of the present invention will be described in detail with reference to the accompanying drawings. The configuration of the present invention and the effects thereof will be clearly understood by the detailed description below. In the following detailed description of the present invention, it should be noticed that same components are designated by the same reference numerals as far as possible although they are illustrated in different drawings, and the specific description of known features is omitted so as not to obscure the scope of the invention.

FIG. 1 is a configuration view illustrating an AlGaN/GaN HEMT element according to an embodiment of the present invention, flip-chip bonded to on a module substrate.

Referring to FIG. 1, in an AlGaN/GaN HEMT element 10 according to an embodiment of the present invention, an AlGaN/GaN layer 13 is grown on a wafer 14 made of silicon carbide (SiC), sapphire, silicon (Si), etc.

In a process for an AlGaN/GaN HEMT element, active such as a source, a drain, and a gate, are formed, and a contact pad 11 for connecting a signal line to an ohmic contact of the source and the drain is formed. In FIG. 1, the contact pad 11 is a source or drain contact pad. Also, a gate contact pad 12 for connecting a signal line to a gate ohmic contact is formed.

Meanwhile, a substrate 20 for modularization is made of alumina ($Al_2O_3$), AlN, or the like. On the upper surface of the substrate, a signal line 21, and a bonding pad 24 are formed. The AlGaN/GaN HEMT element 10 is mounted on the substrate 20 through a bump 23.

A metal material forming the bump 23 for flip-chip bonding is preferably similar to a metal material forming the contact pad 11 of the HEMT element, and the bonding pad 24 of the substrate.

Also, in order to flip-bond the HEMT element 10 to the substrate 20, the HEMT element 10 and the substrate 20 have to be heated, respectively, up to a temperature where the bump 23 is molten. Herein, the element 10 is preferably heated at a heating temperature lower than a process temperature of an active element so that it is not damaged by bonding. The bump 23 has to be made of a material which is molten at a temperature lower than a process temperature of the active element.

Figure 2:
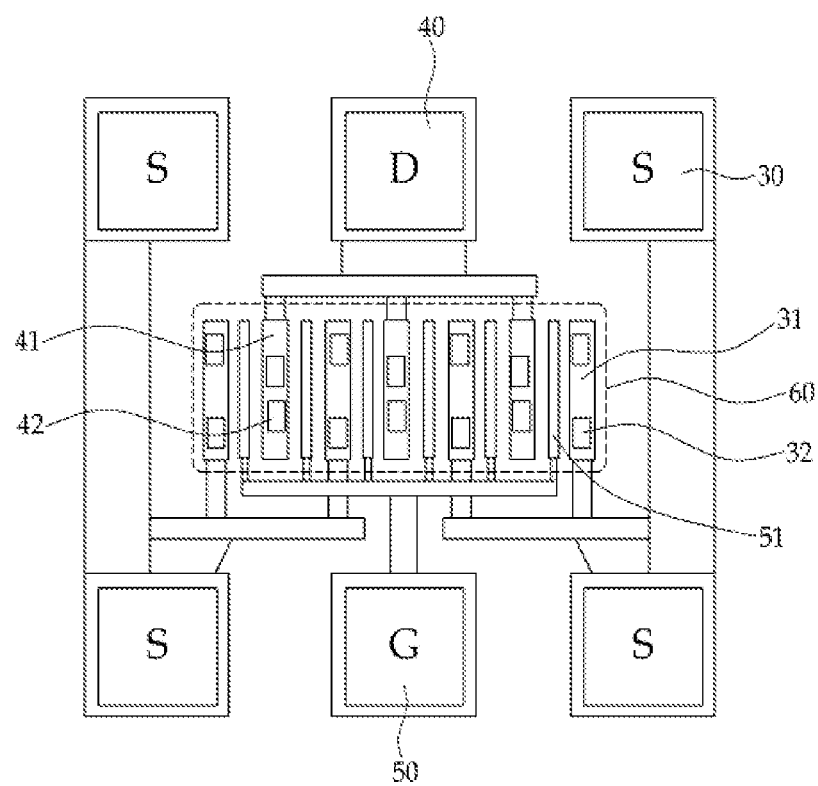
FIG. 2 is a configuration view illustrating a bonding pad of an AlGaN/GaN HEMT element according to an embodiment of the present invention.

FIG. 2 is a configuration view illustrating an AlGaN/GaN HEMT element according to an embodiment of the present invention.

In the HEMT element shown in FIG. 2, the region where a source 31, a drain 41, and a gate 51 are formed is designated by an active region 60, a contact pad 30 of the source is designated by S, a contact pad 40 of the drain is designated by D, and a contact pad 50 of the gate is designated by G.

When the HEMT element is mounted on the substrate, the contact pads 30, 40, and 50 of the source, the drain, and the gate of the HEMT element are bonded to source, drain, and gate contact bonding pads of the substrate, respectively. Herein, they are bonded in a top/bottom or left/right symmetrical structure. Accordingly, the contact pad of the HEMT element has to be designed in a structure symmetrical to the bonding pad of the substrate.

Also, according to an embodiment of the present invention, when the passivated bonding pad of the HEMT element is opened in order to flip-chip bond the HEMT element, a sub source contact pad 32 and a sub drain contact pad 42, as well as the source contact pad 30, the drain contact pad 40, and the gate contact pad 50, are opened in the source and the drain in the active region 60.

When the sub source contact pad 32 and the sub drain contact pad 42 are opened, their shape and size are smaller than the size of the source 31 and the drain 41 in proportion to the shape and the size of the bump to be formed on their respective corresponding pads, that is, a sub source contact bonding pad 91 and a sub drain contact bonding pad 71 of the substrate.

Figure 3:
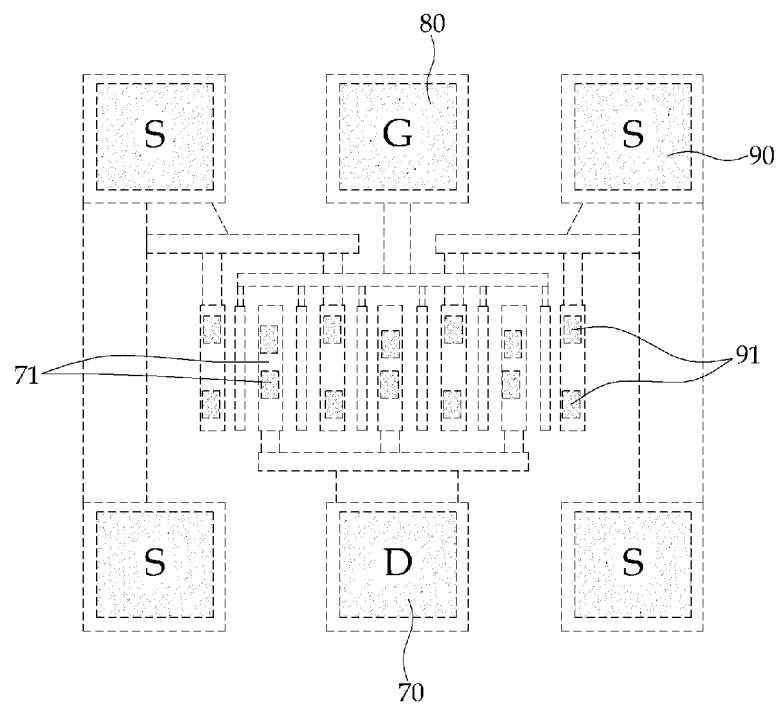
FIG. 3 is a configuration view illustrating a module substrate's bonding pad for flip-chip bonding, according to an embodiment of the present invention.

FIG. 3 is a configuration view illustrating a module substrate and a bump to which an HEMT element according to an embodiment of the present invention is flip-chip bonded.

In FIG. 3, a source contact bonding pad 90, a drain contact bonding pad 70, and a gate contact bonding pad 80 of the module substrate are configured to be up/bottom symmetrical to the source contact pad 30, the drain contact pad 40, and the gate contact pad 50 of the HEMT element.

The sub source contact bonding pad 91 and the sub drain contact bonding pad 71 of the substrate are formed respectively corresponding to the shape and size of the sub source contact pad 32 and the sub drain contact pad 42 of the HEMT element. Herein, the bump to be formed for flip-chip bonding is made of a metal material similar to that of the pad of the HEMT element, and the pad of the substrate.

In general, in the AlGaN/GaN HEMT element, an ohmic contact metal of the source 31 and the drain 41 in the active region 60 includes Au, and also the source contact pad 30, the drain contact pad 40, and the gate contact pad 50 include Au. Thus, it is preferable that the source contact bonding pad 90, the drain contact bonding pad 70, the gate contact bonding pad 80, the sub source contact bonding pad 91, and the sub drain contact bonding pad 71 of the substrate include Au. Also, the process temperature of the element is about 300° C., and a material such as SnAu having a bonding temperature of about 250° C. is deposited by e-beam evaporation to form a bump.

According to another embodiment, the source contact bonding pad 90, the drain contact bonding pad 70, and the gate contact bonding pad 80 of the substrate may be configured to be left/right symmetrical to the source contact pad 30, the drain contact pad 40, and the gate contact pad 50 of the HEMT element.

Figure 4:
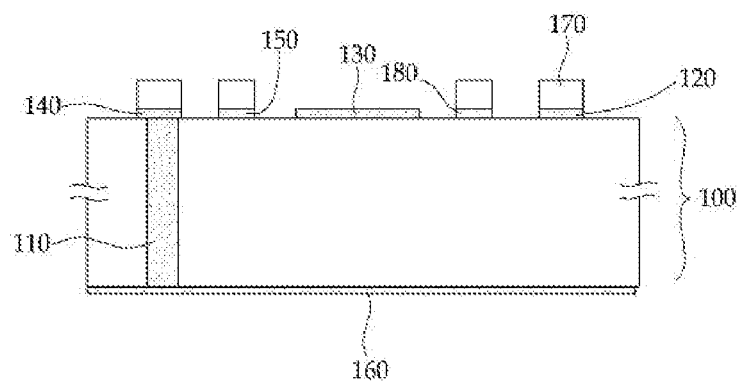
FIG. 4 is a configuration view illustrating a thermal via and a backside metal formed on a module substrate, according to an embodiment of the present invention.

FIG. 4 is a configuration view illustrating a thermal via formed in a module substrate, and a metal formed on the rear surface of the substrate, according to an embodiment of the present invention.

In a module substrate 100, a source contact bonding pad 140 to be bonded to the source contact pad 30 of the HEMT element is formed with a through via 110 penetrating the substrate in the lower side thereof, and the through via is connected to a back side metal 160 of the rear surface of the substrate.

A signal is sent to the drain and the gate of the HEMT element, is applied through a trace 130 on the substrate. A bonding pad 120 on the substrate indicates the drain or gate contact bonding pad of the substrate, to be bonded to the contact pad of the drain or the gate of the HEMT element. A bonding pad 150 on the substrate indicates a sub drain contact bonding pad 150 of the substrate, to be bonded to the sub drain contact pad 42 of the HEMT element.

Also, a bonding pad 180 on the substrate indicates a sub source contact bonding pad 180 of the substrate, to be bonded to the sub source contact pad 32 of the HEMT element.

On the rear surface of the substrate, the back side metal 160 is coated which contacts with a metal housing module to quickly radiate the heat generated from the HEMT element, and reduces a noise by widening a grounding surface of the element.

The through via 110 of the module substrate is formed by a laser with the same size as that of the source contact bonding pad 140 of the substrate 100, or a size slightly smaller than that of the source contact bonding pad 140, and a via hole is filled with a high heat-conductive metal such as copper through printing. Then, the back side metal 160 of the substrate is formed with a copper metal with a thickness of about 5 μm through a printing method, or Ti/Au is deposited with a thickness of 0.5 μm or less through sputtering or e-beam evaporation and Au is deposited with a thickness of 3 μm is deposited through electroplating.

Also, the formation of the source contact bonding pad 140, the sub drain contact bonding pad 150, the sub source contact bonding pad 180, the gate contact bonding pad 120, and the trace 130 of the substrate is carried out through a thin film process by using a chromium mask.

In the process, first, the front surface of the substrate is coated with a photosensitive film, and then the photosensitive film is subjected to an exposure and developing process by using a mask. Then, the source contact bonding pad 140, the sub drain contact bonding pad 150, the sub source contact bonding pad 180, the gate contact bonding pad 120, and the trace 130 are opened. Next, Ti/Au is deposited with a thickness of about 0.5 μm by e-beam evaporation, and the photosensitive film is removed.

Then, on the front surface of the substrate, Ti/Au as a seed metal is sputtered with several hundreds Å/several tens Å. Then, the front surface of the substrate is coated with a photosensitive film, and then the photosensitive film is subjected to an exposure and developing process by using a mask. Next, the source contact bonding pad 140, the sub drain contact bonding pad 150, the sub source contact bonding pad 180, the gate contact bonding pad 120, and the trace 130 are opened, and Au is plated with a thickness of about 1 μm.

Next, the photosensitive film is totally removed. Then, the photosensitive film is coated again on the front surface of the substrate, and subjected to an exposure and developing process by using a mask. Next, the source contact bonding pad 140, the sub drain contact bonding pad 150, the sub source contact bonding pad 180, and the gate contact bonding pad 120 are opened, and Au is plated with a thickness of about 5 μm through electroplating so as to form a bump 170. Then, the photosensitive film is removed, and the seed metal is removed by wet-etching.

Although the present invention has been described for illustrative purposes, those skilled in the art will appreciate that various modifications, additions and substitutions are possible, without departing from the technical spirit of the invention. Accordingly, the embodiments described in the specification of the present invention do not limit the present invention. The scope of the present invention is defined by the claims appended hereto, and it is understood that various technologies may be made within a scope equivalent to the scope of the technical idea of the present invention.

What is claimed is:

1. A GaN-based compound power semiconductor device comprising:
   a GaN-based compound element formed on a wafer;
   a contact pad for forming a source, a drain, and a gate in the GaN-based compound element;
   a module substrate to which the GaN-based compound element is flip-chip bonded;
   a bonding pad formed on the module substrate; and
   a bump formed on the bonding pad in such a manner that the contact pad is bonded to the bonding pad to flip-chip bond the GaN-based compound element to the module substrate,
   wherein the module substrate is formed with a through via with a size smaller than a size of the bonding pad in order to radiate heat generated from the GaN-based compound element.

2. The GaN-based compound power semiconductor device as claimed in claim 1, wherein the contact pad is disposed in a top/bottom or left/right symmetrical structure to the bonding pad.

3. The GaN-based compound power semiconductor device as claimed in claim 1, wherein the GaN-based compound element has a sub source contact pad or a sub drain contact pad formed in the source or the drain respectively in an active region.

4. The GaN-based compound power semiconductor device as claimed in claim 3, wherein the module substrate further comprises a sub source contact bonding pad or a sub drain contact bonding pad which respectively correspond to the sub source contact pad or the sub drain contact pad.

5. The GaN-based compound power semiconductor device as claimed in claim 1, wherein the bump is molten at a temperature lower than a process temperature of the GaN-based compound element.

6. The GaN-based compound power semiconductor device as claimed in claim 1, wherein the module substrate is formed with a metal at a back side of the module substrate so that the heat radiated through the through via is radiated through a housing.

7. The GaN-based compound power semiconductor device as claimed in claim 1, wherein the GaN-based compound element is grown on the wafer.

* * * * *